United States Patent
Ambühl

(10) Patent No.: US 11,048,653 B2
(45) Date of Patent: Jun. 29, 2021

(54) INTEGRATED CIRCUIT INPUTS AND OUTPUTS

(71) Applicant: Nordic Semiconductor ASA, Trondheim (NO)

(72) Inventor: Rolf Ambühl, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 106 days.

(21) Appl. No.: 15/736,762

(22) PCT Filed: Jun. 16, 2016

(86) PCT No.: PCT/GB2016/051793
§ 371 (c)(1),
(2) Date: Dec. 14, 2017

(87) PCT Pub. No.: WO2016/203240
PCT Pub. Date: Dec. 22, 2016

(65) Prior Publication Data
US 2018/0189210 A1    Jul. 5, 2018

(30) Foreign Application Priority Data

Jun. 16, 2015  (GB) .................................... 1510606

(51) Int. Cl.
*G06F 13/26* (2006.01)
*G06F 13/20* (2006.01)
*H01L 23/00* (2006.01)

(52) U.S. Cl.
CPC ............ *G06F 13/26* (2013.01); *G06F 13/20* (2013.01); *H01L 24/18* (2013.01); *H01L 2924/1432* (2013.01)

(58) Field of Classification Search
CPC .. G06F 13/385; G06F 13/4022; G06F 13/364; G06F 13/4081
(Continued)

(56) References Cited

U.S. PATENT DOCUMENTS 6,894,632 B1 * 5/2005 Robinson ............... H03M 1/005
341/143
6,971,004 B1   11/2005 Pleis et al.
(Continued)

FOREIGN PATENT DOCUMENTS

KR         20030046239 A      6/2003

OTHER PUBLICATIONS

International Search Report and Written Opinion for PCT/GB2016/051793, dated Aug. 31, 2016, 10 pages.
(Continued)

*Primary Examiner* — Faisal M Zaman
(74) *Attorney, Agent, or Firm* — Klarquist Sparkman LLP

(57) ABSTRACT

An integrated circuit microprocessor device comprises a central processing unit (CPU) and a general purpose input or output subsystem (2) having at least one external connection (4). The external connection is configured to provide an input to or output from the device depending upon an associated setting in the general purpose input or output subsystem. At least one further module on the device is configured to be able to request at least a first or a second task which may control a state of the external connection, the general purpose input or output subsystem being configured, upon receipt of conflicting requests for the first and second tasks, to apply a predetermined priority to allow only one of the tasks to be applied to the external connection.

9 Claims, 1 Drawing Sheet

Figures 1, 2:
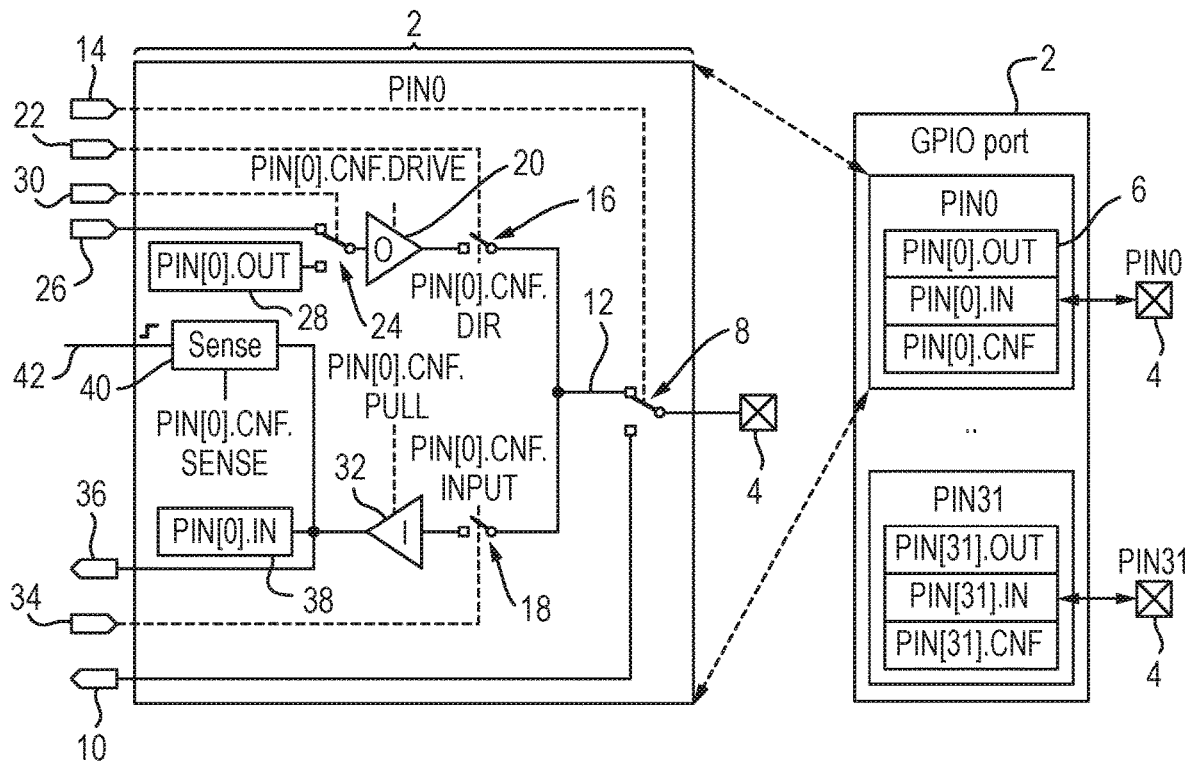

(58) Field of Classification Search
USPC ...... 710/110, 305, 316, 62, 1, 14, 36, 8, 104
See application file for complete search history.

(56) References Cited

U.S. PATENT DOCUMENTS

| | | | | |
|---|---|---|---|---|
| 6,981,090 | B1* | 12/2005 | Kutz | G06F 13/4022 257/666 |
| 8,179,161 | B1 | 5/2012 | William et al. | |
| 2002/0083251 | A1* | 6/2002 | Chauvel | G06F 1/206 710/240 |
| 2004/0107303 | A1* | 6/2004 | Mulligan | G06F 1/1613 710/1 |
| 2005/0036765 | A1* | 2/2005 | Nonaka | G11B 20/00086 386/259 |
| 2005/0180467 | A1* | 8/2005 | Kim | H04H 20/28 370/536 |
| 2010/0057962 | A1* | 3/2010 | Okada | G06F 13/1605 710/113 |
| 2010/0125717 | A1* | 5/2010 | Navon | G06F 9/3824 712/30 |
| 2013/0080677 | A1* | 3/2013 | Simmons | G06F 13/4068 710/316 |
| 2014/0075064 | A1* | 3/2014 | Minegishi | G06F 13/4022 710/69 |
| 2015/0127864 | A1 | 5/2015 | Stark | |
| 2015/0254198 | A1* | 9/2015 | Anderson | G06F 13/364 710/110 |
| 2015/0261704 | A1* | 9/2015 | Vaccaro | G06F 13/364 710/114 |
| 2016/0265982 | A1* | 9/2016 | Bachand | G01K 3/00 |

OTHER PUBLICATIONS

Search Report under Section 17(5) for GB1510606.5, dated Jan. 11, 2016, 3 pages.

* cited by examiner

| 1st task | 2nd task | State of pin 4 |
|---|---|---|
| OUT None | CLR | No change |
| OUT None | SET | No change |
| OUT LoToHi | CLR | High |
| OUT LoToHi | SET | High |
| OUT HiToLo | CLR | Low |
| OUT HiToLo | SET | Low |
| CLR | SET | Low |

INTEGRATED CIRCUIT INPUTS AND OUTPUTS

CROSS REFERENCE TO RELATED APPLICATIONS

This is the U.S. National Stage of International Application No. PCT/GB2016/051793, filed Jun. 16, 2016, which was published in English under PCT Article 21(2), which in turn claims the benefit of Great Britain Application No. 1510606.5, filed Jun. 16, 2015.

This invention relates to inputs and outputs for integrated circuits—particularly general purpose input/output pins for a microprocessor or System on Chip (SoC) device.

With the increasing complexity of modern microprocessors and SoC's, there is an increasing demand to provide inputs and outputs associated with the various functions. However these require pins projecting from the external casing of the device and so the number which can be provided is limited by the constraints on physical size posed by the somewhat conflicting demand for ever-increasing miniaturisation.

One approach for addressing this tension is to provide a number of general purpose input/output (GPIO) pins whose function can be allocated dynamically in software by tasks which are running. This allows efficient use of pins rather than having a lot of dedicated pins which may not be used very much, or at all in some applications or by some customers. One drawback however is that careful management is required to avoid a situation whereby the state of a given pin is ambiguous, or glitches in inputs or outputs are caused. This is particularly the case where a pin may be addressed by a peripheral module rather than the central processing unit (CPU)—e.g. using a Peripheral-Peripheral Interface (PPI) which is described in greater detail in WO 2013/088121.

Typically this means that a pin can only be allocated to one particular task at any given time so that, for example, if a SET task requires a GPIO pin to be driven high, a CLR task cannot put the same pin low until the pin has been released by the SET task and can be allocated to the CLR task. Moreover in some arrangements it is not even possible to execute SET and CLR tasks in the same pin at all without involving the CPU. This inability to both set and clear on the same GPIO pin at the same time, or even at all without invoking the CPU, limits the speed at which functions can be carried out, power usage and the overall flexibility of the device.

Although in some arrangements it may be possible to use a TOGGLE function to toggle the state of the pin rather than using individual SET and CLR tasks, this requires an underlying state machine which knows the current state of the GPIO pin at all times which may not be possible in some situations, particularly if the CPU is not in an active state.

When viewed from a first aspect the invention provides an integrated circuit microprocessor device comprising a central processing unit (CPU) and a general purpose input or output subsystem having at least one external connection, the external connection being configured to provide an input to or output from the device depending upon an associated setting in the general purpose input or output subsystem, wherein at least one further module on the device is configured to be able to request at least a first or a second task which may control a state of said external connection, said general purpose input or output subsystem being configured, upon receipt of conflicting requests for said first and second tasks, to apply a predetermined priority to allow only one of the tasks to be applied to the external connection.

Thus it will be seen by those skilled in the art that in accordance with the invention, multiple tasks are allowed access to a GPIO connection but a priority is applied if conflicting requests to execute such tasks are received. This a completely different approach to the managements of GPIOs for microprocessors and addresses the shortcomings set out above.

The GPIO subsystem could be arranged simply to ignore signals from the non-prioritized task(s). Alternatively it could comprise a buffer to store such outputs which can then be sent after the prioritized task's output has been sent.

The first and second tasks could be any of a number of different tasks and will generally depend on the application for which the microprocessor is being used. In an exemplary set of embodiments, the first task comprises a SET task, that is a task which assigns a logic high to the output. In an exemplary set of embodiments, the second task comprises a CLR task, that is a task which clears the output by assigning a logic low to it.

The GPIO subsystem could comprise a single module arranged to apply said predetermined priority and also to manage the external connection(s). In a set of embodiments however the GPIO subsystem comprises a GPIO module arranged to manage the external connection(s)—in a manner known per se in the art—and an intermediate module arranged to apply said predetermined priority to control said external connection(s) via said GPIO module.

In a set of such embodiments the intermediate module comprises one or more channels which can be associated with the or each external connection and which is/are arranged to change the state of the associated external connection to either high or low. In a set of embodiments the intermediate module channel can receive signals from a plurality of channels connected to one or more further modules on the microprocessor. These channels may form part of a peripheral-to-peripheral interface (PPI) that does not pass via a central processing unit (CPU). The signals may be received simultaneously. It will be appreciated by those skilled in the art that this could be within the same clock cycle or, in asynchronous systems, within a predetermined time window.

The predetermined priority could be fixed but in a set of embodiments it can be determined in software—e.g. by writing to an appropriate register. This provides maximum flexibility.

An embodiment of the invention will now be described, by way of example only, with reference to the accompanying drawings in which:

FIG. 1 is a schematic representation if a GPIO module in accordance with the invention; and FIG. 2 is a table showing the effect of the intermediate module applying the predetermined priority.

FIG. 1 illustrates a GPIO module 2 which is included as part of an integrated circuit microprocessor. The GPIO module 2 supports thirty two external connections in the form of pins 4 numbered PIN0 to PIN31, only the first and last of which are shown in FIG. 1. Each pin 4 has an associated channel 6 in the GPIO module which includes three registers labelled PIN[n].OUT, PIN[n].IN and PIN[n].CNF.

The channel 6 corresponding to PI NO is represented in greater detail in the left hand portion of FIG. 1. This shows that the pin 4 is connected to a switch 8 which allows the pin 4 to be selectively connected to an analogue input line 10 for providing an analogue input to elsewhere on the microprocessor. Alternatively the switch 8 may connect the pin 4 to a connection 12 for a digital input/output arrangement, described in more detail below. The switch is controlled by an 'analogue enable' control line 14 which is made to go high when the microprocessor expects to receive analogue inputs.

The digital input/output arrangement connection 12 is connected to two switched 16, 18. The first of these switches 16 allows the pin 4 to be connected to an output buffer 20. The switch 16 is controlled by a 'direction override' line 22. The input to the output buffer 20 is controlled by a further switch 24 which allows the buffer 20 to be connected either to an output line 26 from an intermediate module for implementing SET and CLR tasks as will be described below, or for providing an ordinary output from the microprocessor via the PIN[0].OUT register 28. The switch 24 is controlled by an 'output override' line 30 which therefore allows the pin 4 to be forced to the value on the output line 26.

On the digital input side, the switch 18 selectively connects the pin 4 to the input buffer 32 under the control of an 'input override' line 34. This allows a peripheral that takes over control of the GPIO pin to use it as an output to disconnect the input buffer 32 which is beneficial as the input buffer typically consumes energy even if not being used. The input buffer 32 is connected to an input line, the PIN[0].IN register 38 which is used by the CPU to find out the state of the pin 2 and a sensing module 40 which senses when the input goes high and then generates a PIN0.DETECT signal 42.

Corresponding arrangements are provided for the other pins PIN1-PIN31.

In use the module 2 acts like a conventional general purpose input/output module. The pin 4 can therefore be used to receive an analogue input by setting the analogue enable line 14 high. It can also be used as a digital input pin by setting the analogue enable line 14 low, the input override line 35 high to close the switch 18 and setting the direction override line 22 low to open the switch 16. Although in most cases it will be desirable to have one of the switches 16, 18 open while the other is closed, there may be circumstances where both are closed. The pin 4 can be used as a digital output pin by setting the analogue enable line 14 low, the input override line 35 low to open the switch 18 and setting the direction override line 22 high to close the switch 16.

In the latter case the pin 4 normally provides output from the PI N[0].OUT register 28. However if it is required to SET the pin 4 by driving it high or CLR the pin 4 by driving it low, the output override line 30 is made high which connects the output buffer 20 to the output line 26 to drive it high or low accordingly.

In accordance with the invention, another module known as the general purpose input/output tasks and events (GPIOTE) module (not shown) is used to access the pins 4 in the GPIO module 2 using tasks and events. The GPIOTE module generates events when the state of a pin 4 changes which can be used to carry out tasks through the peripheral-peripheral interface (PPI) system which allows peripherals to communicate one with another without using the CPU and which is described in greater detail in WO 2013/088121.

The GPIOTE module also allows peripherals to drive the GPIO module 2 to change the state on a GPIO pin 2 using SET and CLR tasks. The GPIOTE module has a number of channels, e.g. eight, which can be allocated to specific pins 4, whereby only one such channel can be connected to a given pin at any time. The GPIOTE module connects to the output line 26 and the output override line 30 of the corresponding pin 4. These GPIOTE channels can be accessed by other peripherals using the PPI to generate tasks. Each GPIOTE channel has three tasks available: SET, CLR and a configurable task referred to as OUT which can be used to set, clear or to toggle a given pin. The GPIOTE channel associated with PI NO for example can drive the output override line 30 high to push the level applied to the output line 26 to the PIN 4.

Furthermore in accordance with the invention however the GPIOTE module arbitrates between peripherals on different PPI channels which attempt to set conflicting tasks for a given GPIOTE channel to drive a pin low or high. This is described in more detail with reference to FIG. 2, which shows a table of priorities applied by each GPIOTE channel.

In the implementation described with reference to FIG. 2, the configurable OUT task is given highest followed by CLR and then SET. Considering the first two rows, if the first peripheral requests the OUT task with the setting "None", which indicates that there should be no change in the state of the pin 4, then the pin 4 will not change even if another peripheral tries to initiate a SET or CLR task at the same time.

Considering the third and fourth rows, if the first peripheral requests the OUT task with the LoToHi setting that indicates that the output should go low to high (equivalent to a SET task), the pin 4 is driven high, regardless of the task requested by the second peripheral. Similarly, with reference to the fifth and sixth rows, if the first peripheral requests the OUT task with the HiToLo setting that indicates that the output should go high to low (equivalent to a CLR task), the pin 4 is driven low, regardless of the task requested by the second peripheral.

With reference to the seventh row, if the first peripheral requests a CLR task and the second peripheral requests a SET task, the CLR task is given priority and the pin is driven low.

The invention claimed is:

1. An integrated circuit microprocessor device comprising a central processing unit (CPU) and a general purpose input or output subsystem having at least one external connection, the external connection being configured to provide an input to or output from the device depending upon an associated setting in the general purpose input or output subsystem, wherein the device is configured to be able to request at least a first task and a second task wherein said first and second tasks control a digital logic output state of said external connection, said general purpose input or output subsystem being configured, upon receipt of conflicting requests for said first and second tasks, to apply a predetermined priority to allow only one of the tasks to be applied to the external connection, wherein said CPU is not involved in applying said predetermined priority.

2. The device as claimed in claim 1, arranged to ignore signals from a non-prioritized task.

3. The device as claimed in claim 1, wherein the first task comprises assigning a logic high to the output.

4. The device as claimed in claim 1, wherein the second task comprises assigning a logic low to the output.

5. The device as claimed in claim 1, wherein the general purpose input output (GPIO) subsystem comprises a GPIO module arranged to manage the external connection(s) and an intermediate module arranged to apply said predetermined priority to control said external connection(s) via said GPIO module.

6. The device as claimed in claim 5, wherein the intermediate module comprises one or more channels which can be associated with the or each external connection and which is/are arranged to change the state of the associated external connection to either high or low.

7. The device as claimed in claim 5, wherein the intermediate module channel is arranged to receive signals from a plurality of channels connected to one or more further modules on the microprocessor.

8. The device as claimed in claim 7, arranged to receive said signals simultaneously.

9. The device as claimed in claim 1, wherein the predetermined priority is determined in software.

* * * * *